United States Patent
Kajiyama et al.

(10) Patent No.: US 7,200,034 B2
(45) Date of Patent: Apr. 3, 2007

(54) MAGNETIC MEMORY DEVICE HAVING YOKE LAYER ON WRITE INTERCONNECTION AND METHOD OF MANUFACTURING THE SAME

(75) Inventors: Takeshi Kajiyama, Yokohama (JP); Tomomasa Ueda, Yokohama (JP); Tatsuya Kishi, Yokohama (JP); Hiroaki Yoda, Kawasaki (JP); Hisanori Aikawa, Yokohama (JP); Masatoshi Yoshikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 11/060,301

(22) Filed: Feb. 18, 2005

(65) Prior Publication Data
US 2006/0132984 A1 Jun. 22, 2006

(30) Foreign Application Priority Data
Dec. 17, 2004 (JP) .............................. 2004-366293

(51) Int. Cl.
*G11C 11/00* (2006.01)

(52) U.S. Cl. .................... 365/158; 365/171; 365/173

(58) Field of Classification Search ............... 365/158, 365/171, 173, 51, 63, 66, 69, 72, 161, 175
See application file for complete search history.

(56) References Cited

U.S. PATENT DOCUMENTS

| | | | |
|---|---|---|---|
| 6,510,078 B2 | 1/2003 | Schwarzl | |
| 6,559,511 B1 | 5/2003 | Rizzo | |
| 6,661,688 B2 | 12/2003 | Bloomquist et al. | |
| 6,960,815 B2 * | 11/2005 | Yoda et al. | 257/421 |
| 7,041,603 B2 * | 5/2006 | Amano et al. | 438/704 |
| 7,064,367 B2 * | 6/2006 | Hatate et al. | 257/295 |

\* cited by examiner

*Primary Examiner*—Tuan T. Nguyen
*Assistant Examiner*—Hien N Nguyen
(74) *Attorney, Agent, or Firm*—Oblon, Spivak, McClelland, Maier & Neustadt, P.C.

(57) ABSTRACT

A magnetic memory device includes a magnetoresistance effect element, and a first write interconnection which is arranged under the magnetoresistance effect element and has a first interconnection layer and a first yoke layer, the first interconnection layer having a portion projecting toward the magnetoresistance effect element, and the first yoke layer including a first, a second, and third regions. And the device includes a second write interconnection which is arranged above the magnetoresistance effect element and has a second interconnection layer and a second yoke layer, the second interconnection layer having a portion projecting toward the magnetoresistance effect element, and the second yoke layer including a fourth, a fifth, and sixth regions.

14 Claims, 14 Drawing Sheets

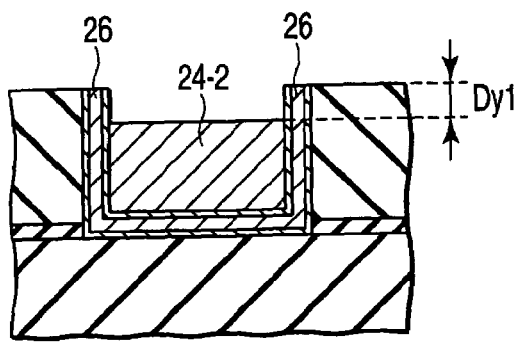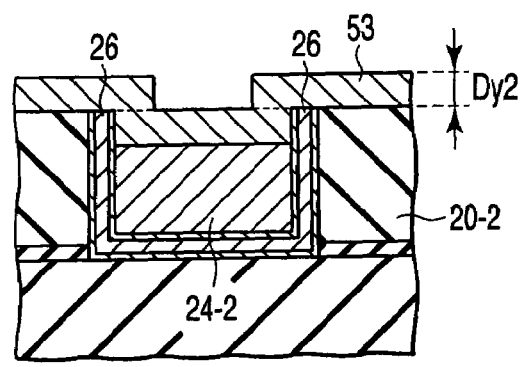
FIG. 10  FIG. 11
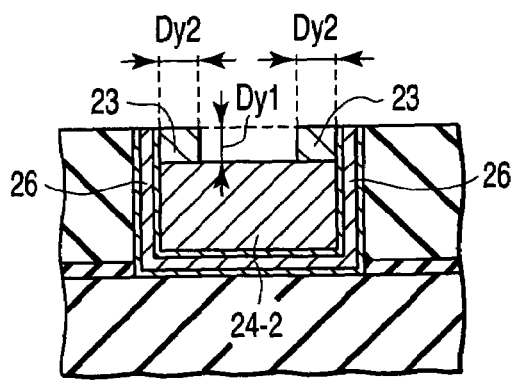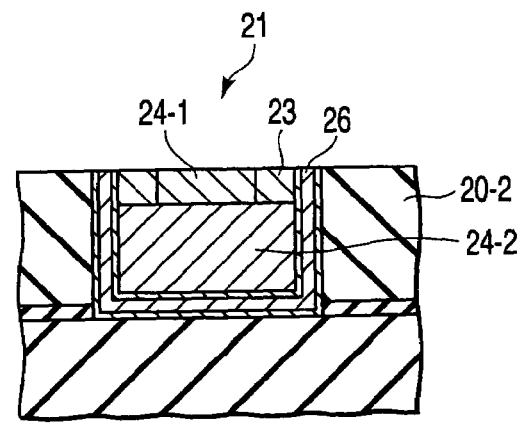
FIG. 12  FIG. 13

MAGNETIC MEMORY DEVICE HAVING YOKE LAYER ON WRITE INTERCONNECTION AND METHOD OF MANUFACTURING THE SAME

CROSS-REFERENCE TO RELATED APPLICATIONS

This application is based upon and claims the benefit of priority from prior Japanese Patent Application No. 2004-366293, filed Dec. 17, 2004, the entire contents of which are incorporated herein by reference.

BACKGROUND OF THE INVENTION

1. Field of the Invention

The present invention relates to a magnetic memory device and a method of manufacturing the same and is applied to, e.g., a magnetic random access memory (MRAM).

2. Description of the Related Art

In recent years, MRAMs which use the magnetoresistance effect of ferromagnetic materials have received a great deal of attention as next-generation solid-state nonvolatile memories capable of implementing fast read/write, large capacity, and low power consumption. Especially, the interest in MRAMs has been growing since it was found that a magnetoresistance effect element having a ferromagnetic tunnel junction exhibited a high magnetoresistance change ratio.

The ferromagnetic tunnel junction basically has a three-layered structure including a free layer (magnetization free layer) whose magnetization direction easily changes depending on an external field, a pinned layer (magnetization fixed layer) which opposes the free layer and maintains a predetermined magnetization direction even upon receiving an external field, and a tunnel barrier layer (insulating layer) which is sandwiched between the free layer and the pinned layer. In the ferromagnetic tunnel junction, a current flows through the tunnel barrier layer. At this time, the resistance of the junction portion changes depending on the relative angle of the magnetization directions of the pinned layer and free layer. When the magnetization directions are parallel, the resistance takes a minimal value. When the magnetization directions are anti-parallel, the resistance takes a maximal value. The change in resistance is called a tunneling magnetoresistance effect (to be referred to as a TMR effect hereinafter). When a magnetic element having a ferromagnetic tunnel junction is actually used as a memory cell of an MRAM, the parallel and anti-parallel states (i.e., minimal and maximal values of resistance) of the magnetizations of the pinned layer and free layer are made to correspond to "0" and "1" of binary information, thereby storing information.

The magnetic information write operation is done by laying out a write interconnection near the memory cell and causing a current magnetic field generated upon supplying a current to reverse only the magnetization direction of the free layer. The magnetic information read operation is executed by supplying a sense current to the memory cell and detecting a change in resistance by the TMR effect. A magnetoresistance effect element using the above-described TMR effect will be referred to as a magnetic tunnel junction (MTJ) element hereinafter.

When MTJ elements are integrated to implement an MRAM of GBit class, a write current necessary for a write in an MTJ element increases. As an attempt to reduce the write current, a simple U-shaped yoke layer which is open to the MTJ element side is formed on the write interconnection (e.g., U.S. Pat. No. 6,661,688).

A conventional magnetic memory device having a U-shaped yoke layer on a write interconnection will be described in more detail with reference to FIGS. 1 and 2. Referring to FIGS. 1 and 2, yoke layers 11 and 12 formed on write interconnections are extracted.

As shown in FIGS. 1 and 2, both the two write interconnections have the U-shaped yoke layers 11 and 12, respectively. An MTJ element is arranged at the intersection between the write interconnections. When write currents I-11 and I-12 are supplied to the write interconnections having the yoke layers 11 and 12, magnetic fields 13 and 14 are generated by the Ampere's law. Since the yoke layers 11 and 12 prevent any leakage of the magnetic fields 13 and 14 around the write interconnections, the write efficiency increases, and the write currents decrease.

However, when a distance L1 between the write interconnections is short (e.g., $L1 \leq 2,000$ Å), the expected write current reducing effect cannot be obtained because of the following factors.

At ends 16 of the yoke layers, a magnetic field M1 generated from the upper write interconnection and a magnetic field M2 generated from the lower write interconnection are directed in the same direction and strengthen each other to produce a synergistic effect. For this reason, the magnetic fields directed toward the MTJ element concentrate at the ends 16. On the other hand, at ends 17 of the yoke layers, the magnetic fields M1 and M2 are directed in opposite directions and weaken each other. The magnetic fields become weak so that a void region of the magnetic fields (magnetic field sink) directed toward the MTJ element is formed at the ends 17.

The write currents should decrease when the distance L1 between the interconnections is decreased by forming the yoke layers 11 and 12 on the interconnection layers. In fact, the effect of the yoke layers 11 and 12 cannot be obtained, and large write currents are still necessary.

In addition, the smaller the distance L1 between the write interconnections is (e.g., $L1 \leq 2,000$ Å), the more conspicuous the increase in write current is. For this reason, the manufacturing process to decrease the distance L1 between the write interconnections to reduce the write currents is useless and only increases the manufacturing cost.

As described above, in the conventional magnetic memory device, when the distance between write interconnections is decreased, magnetic fields near the intersection between the write interconnections become nonuniform and decrease near the element. Hence, the is write currents increase.

BRIEF SUMMARY OF THE INVENTION

According to an aspect of the present invention, there is provided a magnetic memory device comprising a magnetoresistance effect element, a first write interconnection which is arranged under the magnetoresistance effect element and has a first interconnection layer and a first yoke layer, the first interconnection layer having a portion projecting toward the magnetoresistance effect element, and the first yoke layer including a first region which covers sidewalls of the first interconnection layer, a second region which covers a bottom surface of the first interconnection layer, and third regions which are formed in contact with sidewalls of the projecting portion and magnetically coupled to the first region and second region, and a second write interconnection which is arranged above the magnetoresistance effect element and has a second interconnection layer and a second yoke layer, the second interconnection layer having a portion projecting toward the magnetoresistance effect element, and the second yoke layer including a fourth region which covers sidewalls of the second interconnection layer, a fifth region which covers an upper surface of the second interconnection layer, and sixth regions which are formed in contact with sidewalls of the projecting portion and magnetically coupled to the fourth region and fifth region.

According to an aspect of the present invention, there is provided a method of manufacturing a magnetic memory device, comprising forming a trench in a first insulating layer and forming a first yoke layer along an inner wall of the trench, forming a first conductive layer on the first yoke layer in the trench, recessing an upper surface of the first conductive layer to partially expose sidewalls of the first yoke layer, forming a second yoke layer on the recessed upper surface of the first conductive layer and the exposed sidewalls of the first yoke layer, etching back the second yoke layer up to a surface of the first conductive layer to leave the second yoke layer on the sidewalls of the first yoke layer, burying a second conductive layer on the first conductive layer in the trench and the sidewalls of the second yoke layer to form a first write interconnection, forming a magnetoresistance effect element on the first write interconnection, and forming a second write interconnection on the magnetoresistance effect element.

BRIEF DESCRIPTION OF THE SEVERAL VIEWS OF THE DRAWING

FIG. 10 is a sectional view showing a step in manufacturing the magnetic memory device according to the first embodiment of the present invention;

FIG. 11 is a sectional view showing a step in manufacturing the magnetic memory device according to the first embodiment of the present invention;

FIG. 12 is a sectional view showing a step in manufacturing the magnetic memory device according to the first embodiment of the present invention;

FIG. 13 is a sectional view showing a step in manufacturing the magnetic memory device according to the first embodiment of the present invention;

DETAILED DESCRIPTION OF THE INVENTION

Figure 1:
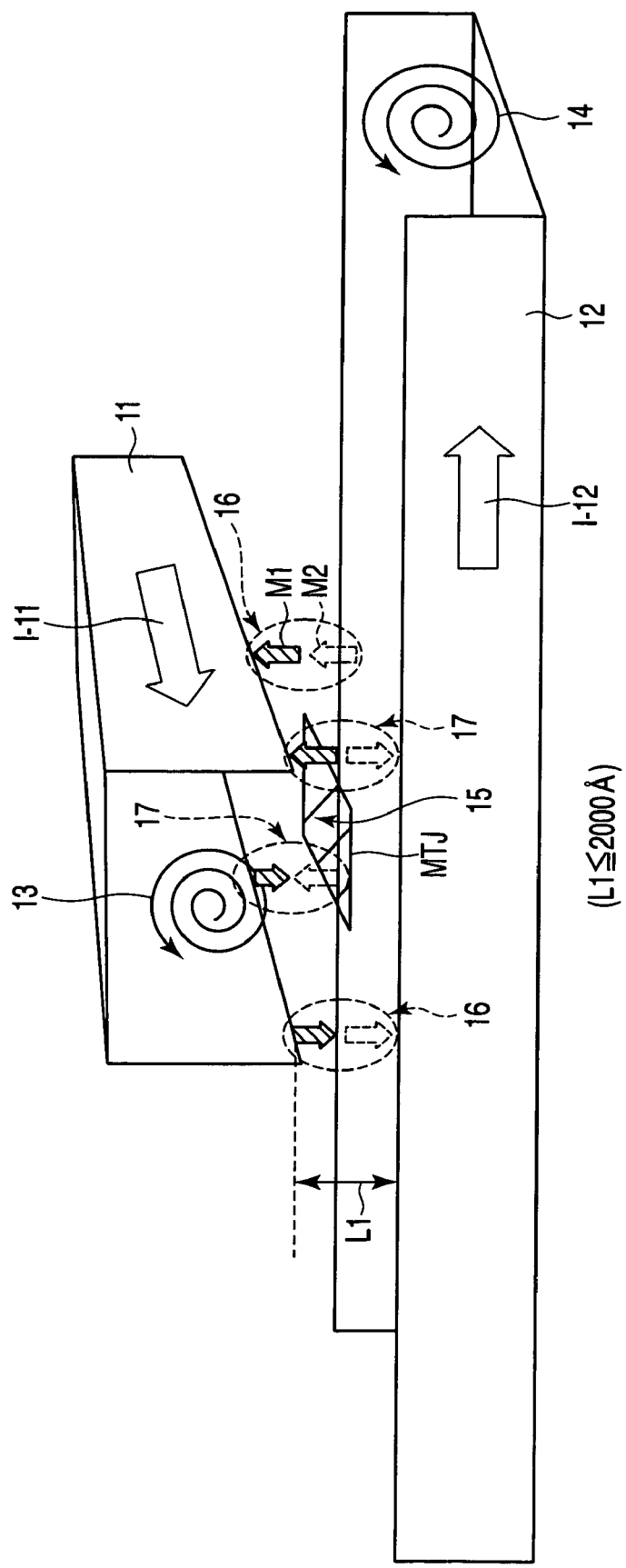
FIG. 1 is a perspective view showing a conventional magnetic memory device.
Figure 2:
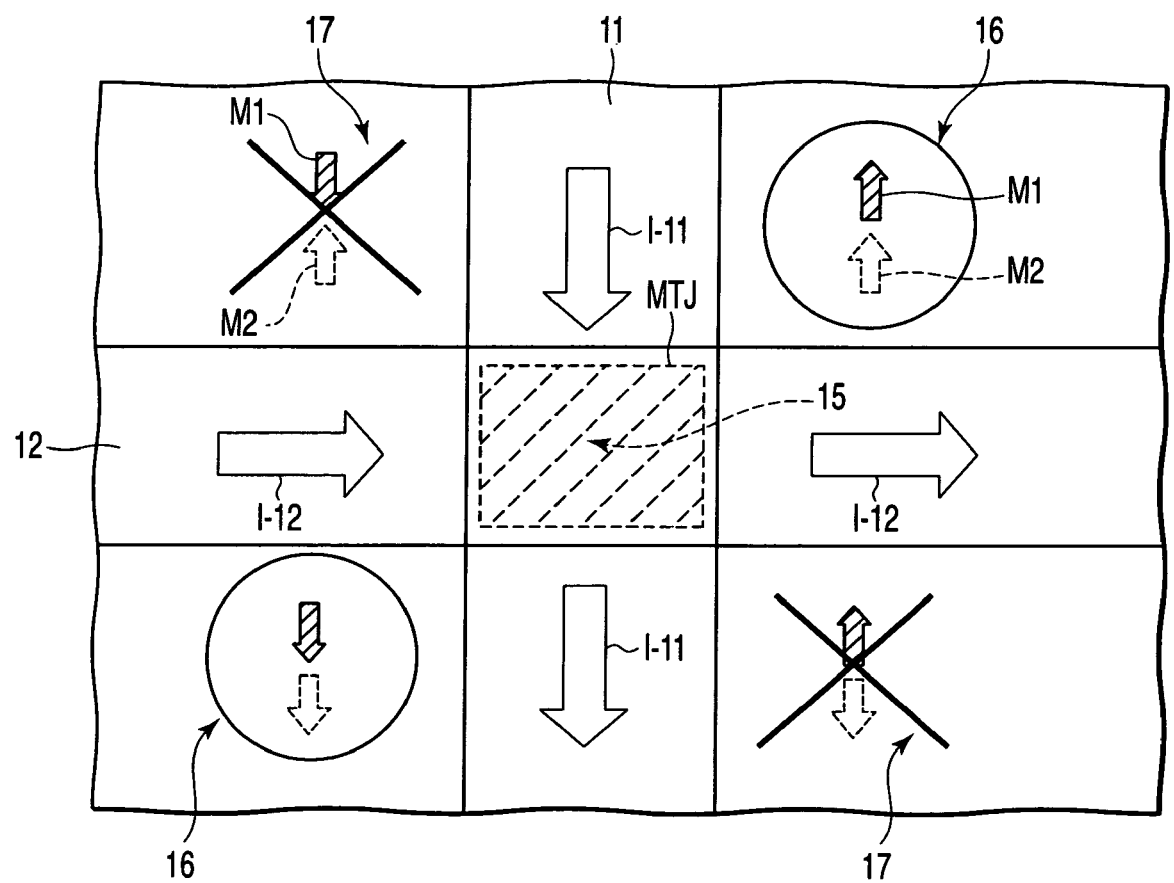
FIG. 2 is a plan view showing the conventional magnetic memory device.

The embodiments of the present invention will be described below with reference to the accompanying drawing. The same reference numerals denote the same parts throughout the drawing.

First Embodiment

Figure 3:
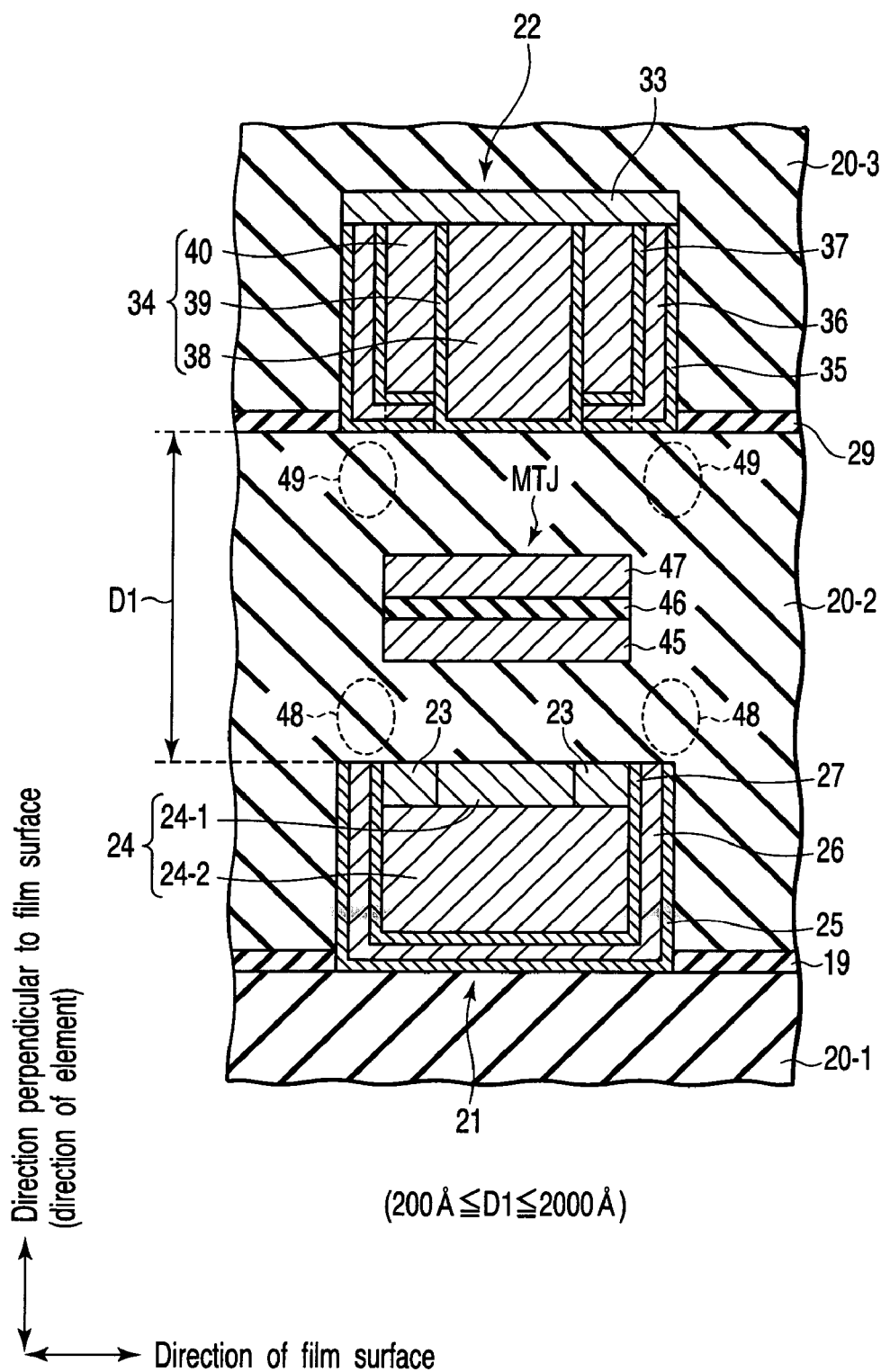
FIG. 3 is a sectional view showing a magnetic memory device according to the first embodiment of the present invention.

A magnetic memory device according to the first embodiment of the present invention will be described with reference to FIG. 3. FIG. 3 is a sectional view schematically showing the magnetic memory device.

As shown in FIG. 3, a write interconnection 21 is arranged under an MTJ element (magnetoresistance effect element). A write interconnection 22 is arranged above the MTJ element such that a distance D1 from the write interconnection 21 falls within the range of 200 to 2,000 Å (200 Å≦D1≦2,000 Å).

The MTJ element is formed in an insulating layer 20-2 and comprises a ferromagnetic layer (e.g., pinned layer) 45, a tunnel insulting layer 46 formed on the ferromagnetic layer 45, and a ferromagnetic layer (e.g., free layer) 47 formed on the tunnel insulting layer 46.

The write interconnection 21 is formed on an insulating layer 20-1 through a stopper film 19. The write interconnection 21 comprises an interconnection portion 24, yoke layer 26 (first and second regions), and yoke layers 23 (third regions). The interconnection portion 24 has an interconnection layer 24-1 (projecting portion) which projects toward the MTJ element, and an interconnection layer 24-2 formed under the interconnection layer 24-1. The yoke layer 26 covers the sidewalls and bottom surface of the interconnection portion 24. The yoke layers 23 are formed in contact with the sidewalls of the interconnection layer 24-1 and magnetically coupled to the yoke layer 26.

As described above, the yoke layers 26 and 23 cover the sidewalls, bottom surface, and part of the upper surface of the interconnection portion. These parts are defined as first to third regions. In this embodiment, the first and second regions are continuously formed as the yoke layer 26.

Barrier metal films 25 and 27 are formed to cover the surfaces of the yoke layer 26.

The upper surfaces of the yoke layers 23, projecting interconnection layer 24-1, and yoke layer 26 continue (are flush with each other).

The projecting interconnection layer 24-1 is electrically connected to the interconnection layer 24-2.

The write interconnection 22 is formed on an insulating layer 20-2 through a stopper film 29. The write interconnection 22 comprises an interconnection portion 34, yoke layers 36 (fourth regions), yoke layer 33 (fifth region), and yoke layers 36 (sixth regions). The interconnection portion 34 has an interconnection layer 38 (projecting portion) which projects toward the MTJ element, an interconnection layer 40 formed on the sidewalls of the interconnection layer 38, and a barrier metal film 39 which covers the side and bottom surfaces of the interconnection layer 38. The yoke layers 36 cover the sidewalls of the interconnection portion 34. The yoke layer 33 covers the upper surface of the interconnection portion 34. The yoke layers 36 are also formed in contact with the sidewalls of the interconnection layer 38 and magnetically coupled to the yoke layers 36 and 33.

As described above, the yoke layers 33 and 36 cover the sidewalls, upper surface, and part of the bottom surface of the interconnection portion 34. These parts are defined as fourth to sixth regions. In this embodiment, the fourth and sixth regions are continuously formed as the yoke layers 36.

Barrier metal films 35 and 37 are formed to cover the surfaces of the yoke layers 36.

The bottom surfaces of the yoke layers 36 and projecting interconnection layer 38 continue (are flush with each other).

The barrier metal films 25 and 27 act as a barrier against diffusion of substances in the interconnection layer 24-1 and yoke layer 26. The barrier metal film 39 acts as a barrier against diffusion of substances in the interconnection layers 38 and 40. The barrier metal films 35 and 37 act as a barrier against diffusion of substances in the yoke layers 36.

The interconnection layers 24-1, 24-2, 38 and 40 are made of, e.g., copper (Cu). The barrier metal films 25, 27, 35, 37, and 39 are made of, e.g., tantalum (Ta) or tantalum nitride (TaN). The yoke layers 23, 26, 33, and 36 are made of, e.g., nickel-iron (NiFe).

The ferromagnetic layers 45 and 47 are made of a ferromagnetic material containing cobalt (Co), iron (Fe), or nickel (Ni) as a major component. The ferromagnetic layers 45 an 47 are made of, e.g., cobalt-iron (CoFe).

According to the above structure, since the write interconnection 21 has the yoke layer 23, a magnetic field generated from the interconnection 21 is guided into the yoke layer 23. Accordingly, field void regions (magnetic field sink) or field concentration regions in vicinities 48 of the ends of the yoke layer 26 are relaxed so that the magnetic field near the MTJ element can be increased. For this reason, the write current can be reduced, and power consumption can be reduced.

Similarly, since the write interconnection 22 has the yoke layers 36, a magnetic field generated from the interconnection 22 is guided into the yoke layers 36. Accordingly, field void regions (magnetic field sink) or field concentration regions in vicinities 49 of the ends of the yoke layers 36 are relaxed so that the magnetic field near the MTJ element can be increased. For this reason, the write current can be reduced.

As described above, the field void regions (magnetic field sink) or field concentration regions in the vicinities 48 and 49 can be relaxed. Since the distance D1 between the write interconnections 21 and 22 can be made as small as 2,000 Å or less, the write currents can be reduced. This is because the magnitudes of write currents increase as the distance D1 between the write interconnections 21 and 22 increases. In addition, when the distance D1 is decreased, the occupation area in the direction perpendicular to the film surface can be reduced so that the device size can be decreased.

Furthermore, when the distance D1 between the write interconnections 21 and 22 is 200 Å or more, an interval almost equal to the minimum thickness of the MTJ element can be ensured.

A method of manufacturing a magnetic memory device will be described next taking the device shown in FIG. 3 as an example.

Figure 4:
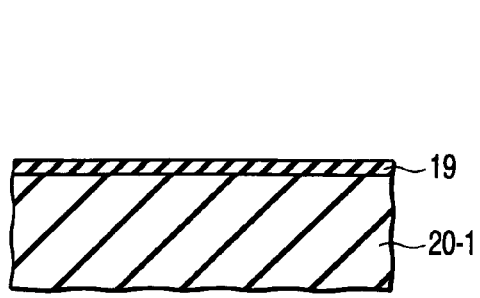
FIG. 4 is a sectional view showing a step in manufacturing the magnetic memory device according to the first embodiment of the present invention.

First, as shown in FIG. 4, the stopper film 19 is formed on the insulating layer 20-1 by a known process.

Figure 5:
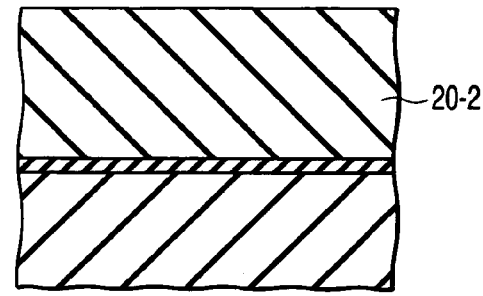
FIG. 5 is a sectional view showing a step in manufacturing the magnetic memory device according to the first embodiment of the present invention.

As shown in FIG. 5, the insulating layer 20-2 is formed on the stopper film 19.

Figure 6:
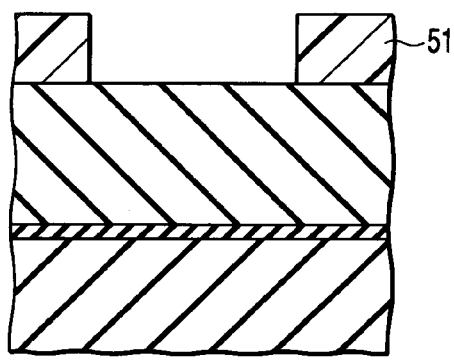
FIG. 6 is a sectional view showing a step in manufacturing the magnetic memory device according to the first embodiment of the present invention.

As shown in FIG. 6, a photoresist 51 is applied to the upper surface of the insulating layer 20-2. The photoresist 51 is exposed and developed to form an opening for forming an interconnection in the insulating layer 20-2.

Figure 7:
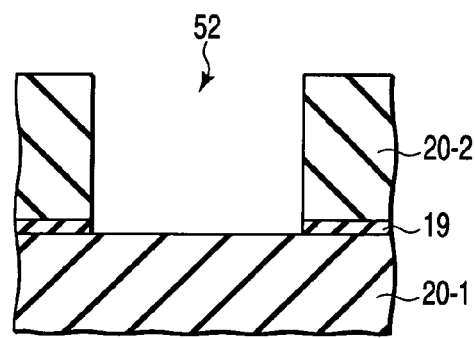
FIG. 7 is a sectional view showing a step in manufacturing the magnetic memory device according to the first embodiment of the present invention.

As shown in FIG. 7, anisotropic etching such as RIE is executed up to the upper surface of the insulating layer 20-1 by using the photoresist 51 as a mask. With this process, a trench 52 extending through the insulating layer 20-2 and stopper film 19 is formed. In this process, the stopper film 19 acts as a stopper against overetching.

Figure 8:
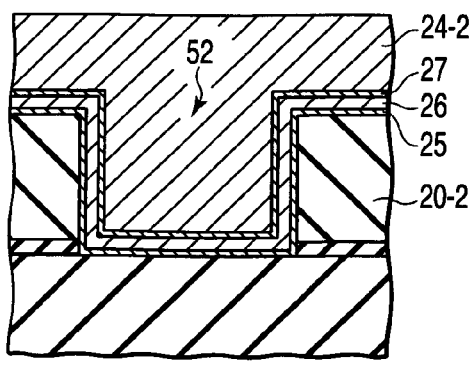
FIG. 8 is a sectional view showing a step in manufacturing the magnetic memory device according to the first embodiment of the present invention.

As shown in FIG. 8, tantalum (Ta) is deposited on the insulating layer 20-1 and along the inner wall of the trench 52 by, e.g., CVD to form the barrier metal film 25. After that, for example, a nickel-iron (NiFe) film is formed on the barrier metal film 25 to form the yoke layer 26. Tantalum (Ta) is further deposited on the yoke layer 26 by the same process to form the barrier metal film 27. After that, copper (Cu) is deposited on the barrier metal film 27 by, e.g., electroplating to form the interconnection layer 24-2.

Figure 9:
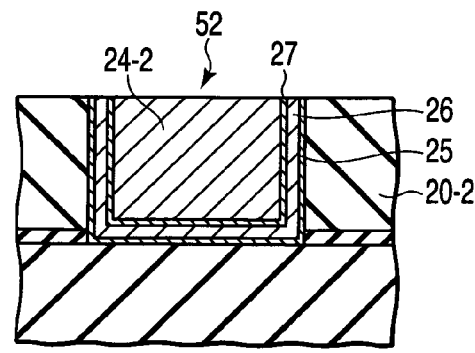
FIG. 9 is a sectional view showing a step in manufacturing the magnetic memory device according to the first embodiment of the present invention.

As shown in FIG. 9, the yoke layer 26, barrier metal films 25 and 27, and interconnection layer 24-2 are planarized up to the upper surface of the insulating layer 20-2 by, e.g. CMP, thereby filling the trench 52.

As shown in FIG. 10, the surface of the interconnection layer 24-2 is recessed to a thickness Dy1 by, e.g., wet etching to expose the upper sidewalls of the yoke layer 26.

As shown in FIG. 11, a nickel-iron (NiFe) layer 53 having a thickness Dy2 is deposited on the insulating layer 20-2, yoke layer 26, and interconnection layer 24-2 by, e.g. sputtering.

As shown in FIG. 12, the nickel-iron layer 53 is etched back by, e.g., ion milling and left on the exposed upper sidewalls of the yoke layer 26 to form the yoke layers 23.

The height of the yoke layer 23 is determined by the recess depth Dy1 of the interconnection layer 24-2. The length of the yoke layer 23 is determined by the thickness Dy2 of the nickel-iron layer 53 deposited on the recessed interconnection layer 24-2.

As shown in FIG. 13, the interconnection layer 24-1 which contacts the yoke layers 23 is formed on the interconnection layer 24-2 by a known process. Planarization is executed up to the upper surface of the insulating layer 20-2 by, e.g., CMP such that the upper surfaces of the yoke layers 26 and 23 and interconnection layer 24-1 continue (are flush with each other), thereby forming the write interconnection 21.

The material of the interconnection layer 24-1 is not limited to copper (Cu). The interconnection layer 24-1 can also be formed from aluminum (Al) by using CVD. When the interconnection layers 24-1 and 24-2 are made of different materials, the resistance value of the interconnection layer 24 can be controlled as needed.

Figure 14:
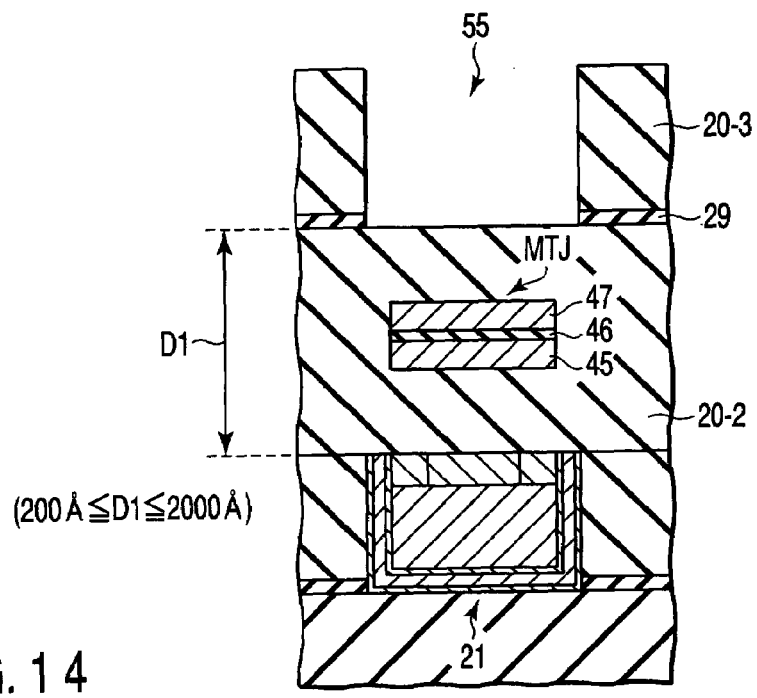
FIG. 14 is a sectional view showing a step in manufacturing the magnetic memory device according to the first embodiment of the present invention.

As shown in FIG. 14, the MTJ element is formed by sequentially forming the ferromagnetic layer 45, tunnel insulting layer 46, and ferromagnetic layer 47 in the insulating layer 20-2 by a known process. At this time, the thickness (distance between write interconnections) D1 of the insulating layer 20-2 falls within the range of 200 to 2,000 Å (200 Å $\leq$ D1 $\leq$ 2,000 Å). After that, the stopper film 29 and an insulating layer 20-3 are sequentially formed on the insulating layer 20-2. By the same process as described above, a trench 55 extending through the insulating layer 20-3 and stopper film 29 and reaching the upper surface of the insulating layer 20-2 is formed. The stopper film 29 acts as a stopper in forming the trench 55.

Figure 15:
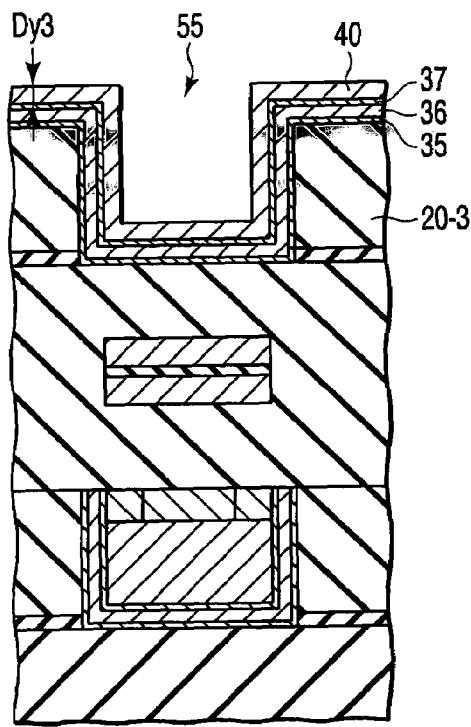
FIG. 15 is a sectional view showing a step in manufacturing the magnetic memory device according to the first embodiment of the present invention.

As shown in FIG. 15, tantalum (Ta) is deposited on the insulating layer 20-3 and along the inner wall of the trench 55 by, e.g., CVD to form the barrier metal film 35. After that, for example, a nickel-iron (NiFe) film is formed on the barrier metal film 35 to form the yoke layers 36. Tantalum (Ta) is further deposited on the yoke layers 36 by the same process to form the barrier metal film 37. After that, copper (Cu) having a thickness Dy3 is deposited on the barrier metal film 37 by, e.g., electroplating to form the interconnection layer 40.

Figure 16:
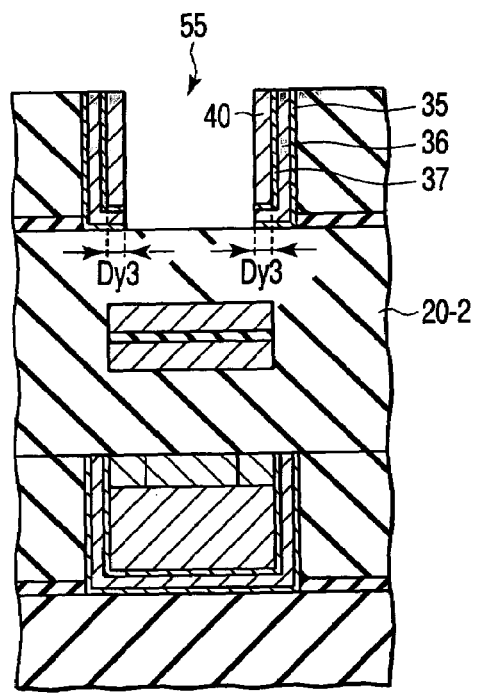
FIG. 16 is a sectional view showing a step in manufacturing the magnetic memory device according to the first embodiment of the present invention.

As shown in FIG. 16, anisotropic etching such as RIE is executed up to the upper surface of the insulating layer 20-2, thereby leaving the yoke layers 36, barrier metal films 35 and 37, and interconnection layer 40 on the sidewalls of the trench 55. With this process, the yoke layers 36 projecting to the inside of the trench 55 are formed. The length of the yoke layer 36 is determined by the thickness Dy3 of the interconnection layer 40.

Figure 17:
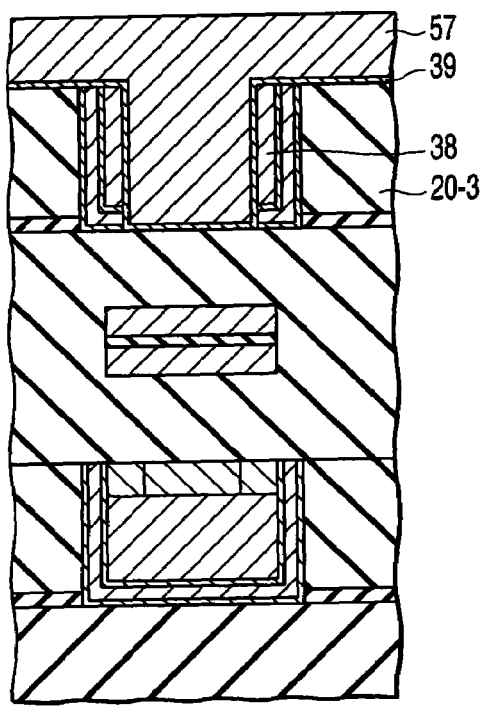
FIG. 17 is a sectional view showing a step in manufacturing the magnetic memory device according to the first embodiment of the present invention.

As shown in FIG. 17, the barrier metal film 39 is formed on the insulating layer 20-3, yoke layers 36, and interconnection layer 40 and along the sidewalls of the interconnection layer 40. After that, a copper (Cu) layer 57 is deposited on the barrier metal film 39 by, e.g., electroplating.

Figure 18:
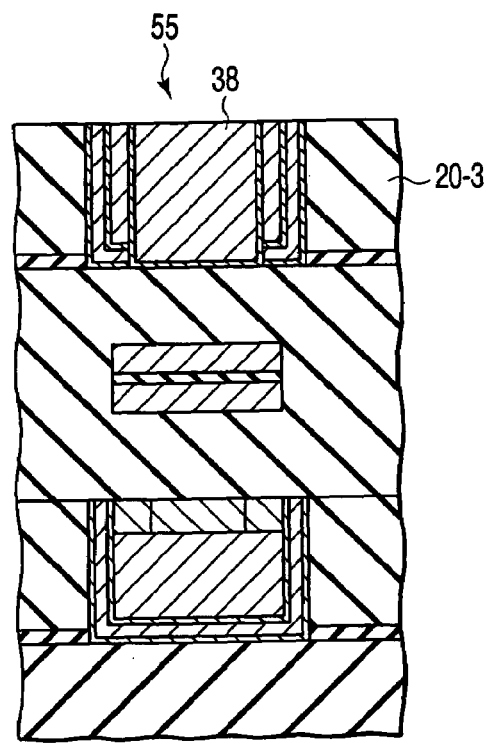
FIG. 18 is a sectional view showing a step in manufacturing the magnetic memory device according to the first embodiment of the present invention.

As shown in FIG. 18, the copper layer 57 is planarized up to the upper surface of the insulating layer 20-3 by, e.g., CMP, thereby filling the trench 55 with the copper layer. With this process, the interconnection layer 38 is formed.

Figure 19:
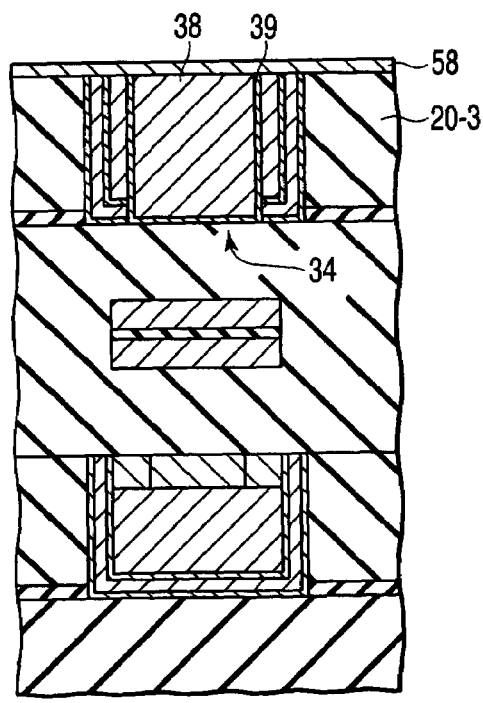
FIG. 19 is a sectional view showing a step in manufacturing the magnetic memory device according to the first embodiment of the present invention.

As shown in FIG. 19, a nickel-iron (NiFe) layer 58 is deposited on the barrier metal film 39 and interconnection layer 38 by, e.g., CVD.

Figure 20:
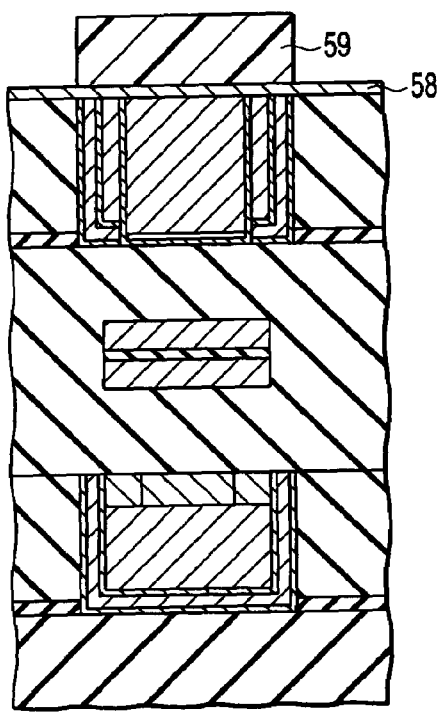
FIG. 20 is a sectional view showing a step in manufacturing the magnetic memory device according to the first embodiment of the present invention.

As shown in FIG. 20, a photoresist is applied to the upper surface of the nickel-iron (NiFe) layer 58. Exposure and development are executed to form a photoresist 59 to expose part except the prospective write interconnection 22.

Figure 21:
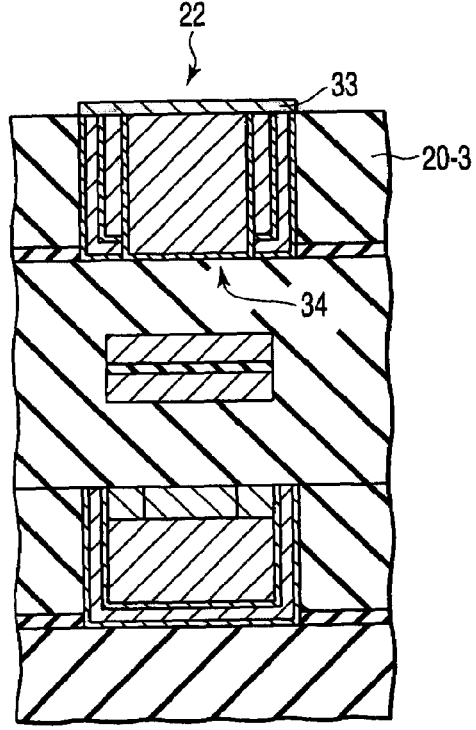
FIG. 21 is a sectional view showing a step in manufacturing the magnetic memory device according to the first embodiment of the present invention.

As shown in FIG. 21, anisotropic etching such as RIE is executed up to the upper surface of the insulating layer 20-3 by using the photoresist 59 as a mask, thereby forming the yoke layer 33. After that, the photoresist 59 is removed so that the write interconnection 22 is formed.

An insulating layer is formed to cover the write interconnection 22 by a known process, thereby completing the magnetic memory device shown in FIG. 3.

According to the above-described magnetic memory device manufacturing method, the height of the yoke layer 23 almost equals the recess depth Dy1 of the interconnection layer 24-2. The length of the yoke layer 23 almost equals the thickness Dy2 of the nickel-iron layer 53 deposited on the recessed interconnection layer 24-2. When reaction conditions in forming the recess depth Dy1 of the interconnection layer 24-2 and the thickness Dy2 are controlled, the height and length of the yoke layer 23 can be selected. For this reason, the magnetic characteristic of the yoke layer 23 can be selected as needed.

The length of the contact portion of the yoke layer 36 to the interconnection layer 38 is determined by the thickness Dy3 of the interconnection layer 40. When reaction conditions in forming the interconnection layer 40 are controlled, the length of the contact portion of the yoke layer 36 to the interconnection layer 38 can be selected. For this reason, the magnetic characteristic of the yoke layer 36 can advantageously be selected as needed.

As shown in FIG. 13, planarization is executed up to the upper surface of the insulating layer 20-2 such that the upper surfaces of the yoke layers 26 and 23 and interconnection layer 24-1 continue (are flush with each other), thereby forming the write interconnection 21. Since the upper surface of the write interconnection 21 is flat, the subsequent manufacturing process is facilitated. In addition, the planarity of the ferromagnetic layers 45 and 47 and tunnel insulting film 46 of the MTJ element formed above the write interconnection 21 can be increased. For this reason, any degradation in magnetic characteristic of the MTJ element can be prevented.

[First Modification (Modification 1 of Lower Write Interconnection)]

Figure 22:
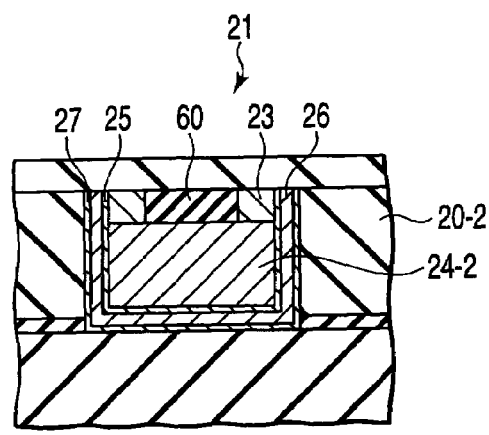
FIG. 22 is a sectional view showing a magnetic memory device according to the first modification of the present invention.

A modification of the write interconnection 21 will be described next with reference to FIG. 22. FIG. 22 is a sectional view showing a write interconnection according to this modification. A description of the same parts as in the first embodiment will be omitted.

As shown in FIG. 22, an insulating layer 60 is buried in place of the interconnection layer 24-1 projecting toward the MTJ element. The upper surfaces of the insulating layer 60, yoke layers 23 and 26, and barrier metal films 25 and 27 continue (are flush with each other).

The insulating layer 60 is formed from an oxide film such as a tetraethyl orthosilicate (TEOS) film. Instead of the insulating layer, a high-resistance layer may be formed at this position. Although not illustrated, the MTJ element and write interconnection 22 are formed above the write interconnection 21.

According to the above-described structure, the same effect as in the first embodiment can be obtained. In addition, since the insulating layer 60 is arranged, the write current flowing between the yoke layers 23 can be reduced, and nonuniformity of the magnetic field can further be relaxed.

A method of manufacturing the write interconnection 21 of the magnetic memory device according to the first modification will be described next with reference to FIGS. 23 and 24.

Figure 23:
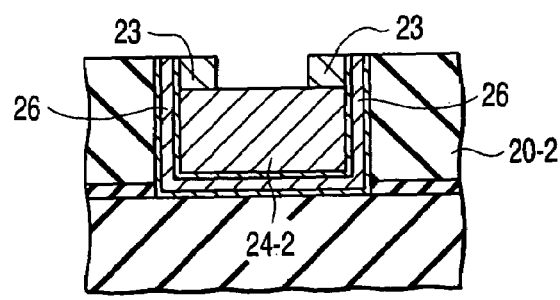
FIG. 23 is a sectional view showing a step in manufacturing the magnetic memory device according to the first modification of the present invention.

As shown in FIG. 23, the yoke layers 23 in contact with the sidewalls of the yoke layer 26 are formed on the interconnection layer 24-2 by the same process as in the first embodiment.

Figure 24:
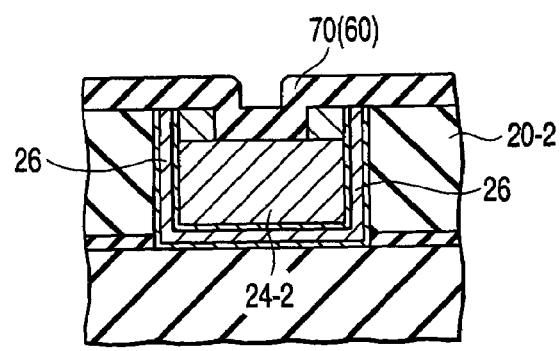
FIG. 24 is a sectional view showing a step in manufacturing the magnetic memory device according to the first modification of the present invention.

As shown in FIG. 24, a TEOS film 70 is formed on the insulating layer 20-2, yoke layers 23 and 26, interconnection layer 24-2, and barrier metal films 25 and 27 by, e.g., CVD using TEOS as a reaction gas. After that, the TEOS film 70 is planarized up to the upper surface of the insulating layer 20-2 by, e.g., CMP to bury the TEOS film 70.

Then, the write interconnection 21 shown in FIG. 22 is formed by a known process.

As described above, according to the method of manufacturing the write interconnection 21 according to the first modification, the same effect as in the first embodiment can be obtained.

[Second Modification (Modification 2 of Lower Write Interconnection)]

Figure 25:
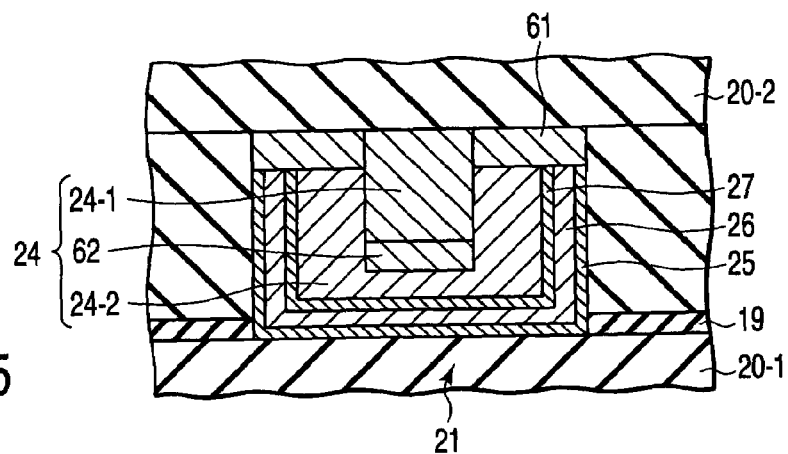
FIG. 25 is a sectional view showing a magnetic memory device according to the second modification of the present invention.

Another modification of the write interconnection 21 will be described next with reference to FIG. 25. FIG. 25 is a sectional view showing a write interconnection according to this modification. A description of the same parts as in the first embodiment will be omitted.

As shown in FIG. 25, yoke layers 61 (third regions) which contact the sidewalls of the interconnection layer 24-1 are formed on the yoke layer 26. The upper surfaces of the yoke layers 61 and interconnection layer 24-1 continue. A conductive layer 62 is formed in the interconnection portion 24. The conductive layer 62 and yoke layers 61 are made of the same material such as nickel-iron (NiFe). The yoke layers 61 and 26 cover the sidewalls, bottom surface and part of the upper surface of the interconnection portion 24. In this modification, the first and second regions are continuously formed as the yoke layer 26.

Although not illustrated, the MTJ element and write interconnection 22 are formed above the write interconnection 21.

According to the above-described structure, the same effect as in the first embodiment can be obtained.

A method of manufacturing the magnetic memory device according to the second modification will be described next with reference to FIGS. 26 to 32.

Figure 26:
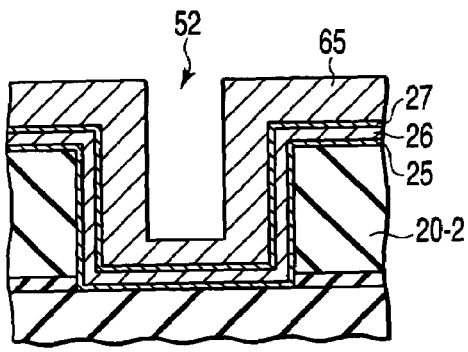
FIG. 26 is a sectional view showing a step in manufacturing the magnetic memory device according to the second modification of the present invention.

As shown in FIG. 26, the barrier metal films 25 and 27 and yoke layer 26 are deposited by the same process as in the first embodiment. After that, a conductive layer 65 made of copper (Cu) is formed on the barrier metal film 27 by, e.g., electroplating.

Figure 27:
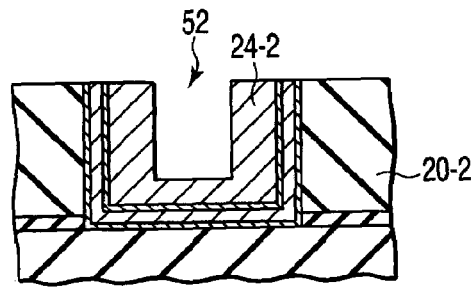
FIG. 27 is a sectional view showing a step in manufacturing the magnetic memory device according to the second modification of the present invention.

As shown in FIG. 27, the barrier metal films 25 and 27, yoke layer 26, and conductive layer 65 are planarized up to the upper surface of the insulating layer 20-2 by, e.g., CMP to fill the trench 52, thereby forming the interconnection layer 24-2.

Figure 28:
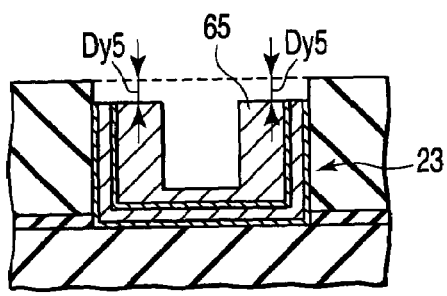
FIG. 28 is a sectional view showing a step in manufacturing the magnetic memory device according to the second modification of the present invention.

As shown in FIG. 28, the upper surfaces of the barrier metal films 25 and 27, yoke layer 26, and conductive layer 65 are recessed to a depth Dy5 by, e.g. wet etching.

Figure 29:
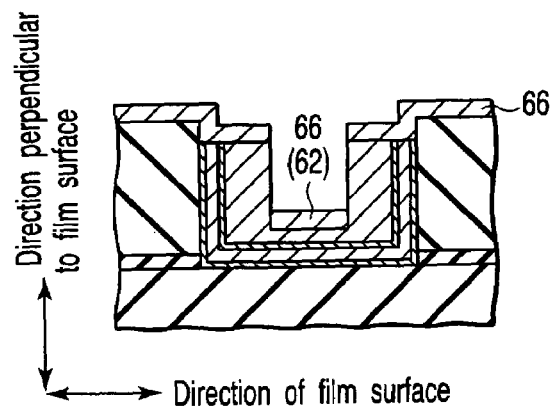
FIG. 29 is a sectional view showing a step in manufacturing the magnetic memory device according to the second modification of the present invention.

As shown in FIG. 29, a magnetic layer 66 of nickel-iron is formed on the barrier metal films 25 and 27, yoke layer 26, and conductive layer 65 by, e.g., sputtering. In this process, the magnetic layer 66 is formed in only the direction perpendicular to the film surface by using the anisotropy of sputtering.

Figure 30:
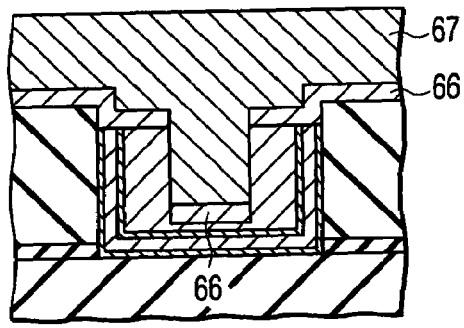
FIG. 30 is a sectional view showing a step in manufacturing the magnetic memory device according to the second modification of the present invention.

As shown in FIG. 30, a conductive layer 67 of copper (Cu) is formed on the magnetic layer 66 by, e.g., electroplating.

Figure 31:
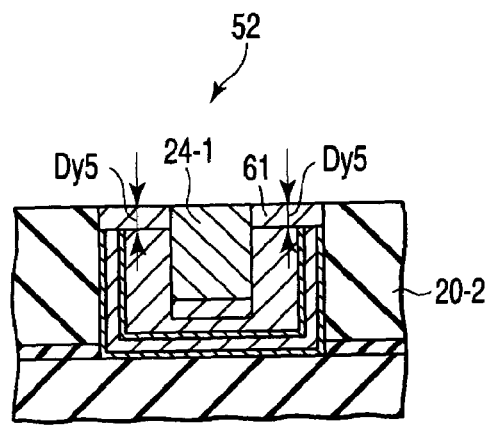
FIG. 31 is a sectional view showing a step in manufacturing the magnetic memory device according to the second modification of the present invention.

As shown in FIG. 31, the conductive layer 67 and magnetic layer 66 are planarized up to the upper surface of the insulating layer 20-2 by, e.g., CMP to fill the trench 52, thereby forming the interconnection layer 24-1 and the yoke layers 61 having the thickness Dy5.

Figure 32:
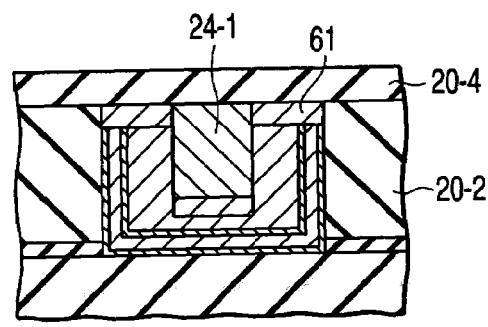
FIG. 32 is a sectional view showing a step in manufacturing the magnetic memory device according to the second modification of the present invention.

As shown in FIG. 32, an insulating layer 20-4 is formed on the insulating layer 20-2, yoke layers 61, and interconnection layer 24-1. With the above-described process, the magnetic memory device shown in FIG. 25 is manufactured.

As described above, according to the above-described magnetic memory device manufacturing method, the same effect as in the first embodiment can be obtained. The height of the yoke layer 61 almost equals the recess depth Dy5 of the yoke layer 23 and conductive layer 65. When reaction conditions in recessing are controlled, the height and length of the yoke layer 61 can be selected. For this reason, the magnetic characteristic of the yoke layer 61 can be selected as needed.

[Third Modification (Modification 1 of Upper Write Interconnection)]

Figure 33:
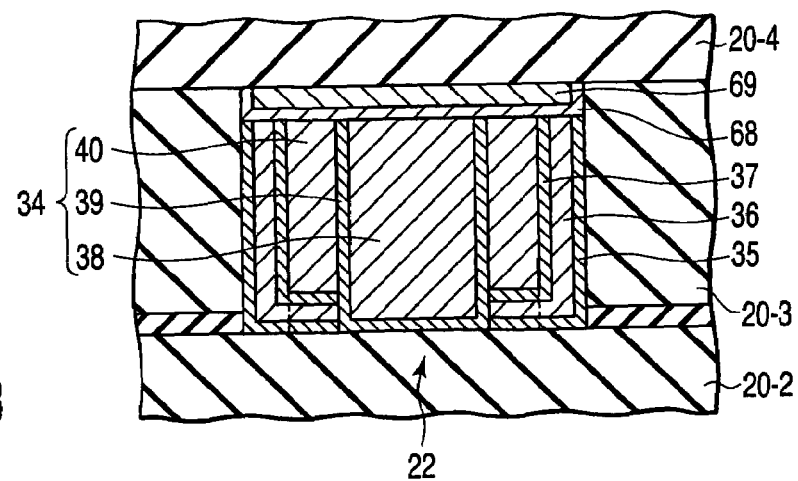
FIG. 33 is a sectional view showing a magnetic memory device according to the third modification of the present invention.

A modification of the write interconnection 22 will be described next with reference to FIG. 33. FIG. 33 is a sectional view showing a write interconnection according to this modification. A description of the same parts as in the first embodiment will be omitted.

As shown in FIG. 33, a yoke layer 69 (fifth region) is formed in the insulating layer 20-3 on the yoke layers 36 and interconnection portion 34. A barrier metal film 68 is formed to cover the side surfaces and bottom surface of the yoke layer 69. The insulating layer 20-4 is formed on the yoke layer 69 and barrier metal film 68. As described above, the yoke layers 69 and 36 cover the sidewalls, upper surface, and part of the bottom surface of the interconnection portion 34. In this modification, the fourth and sixth regions are continuously formed as the yoke layers 36.

The barrier metal film 68 is made of, e.g., tantalum (Ta) and acts as a barrier against diffusion of substances in the interconnection layers 38 and 40 made of copper (Cu).

Although not illustrated, the MTJ element and write interconnection 21 are formed under the write interconnection.

According to the above-described structure, the same effect as in the first embodiment can be obtained. In addition, since the barrier metal film 68 which acts as a barrier against diffusion of substances in the interconnection layers 38 and 40 is formed, the reliability of the write interconnection 22 can be increased.

A method of manufacturing the write interconnection according to the third modification will be described next with reference to FIGS. 34 to 37 taking the write interconnection shown in FIG. 33 as an example.

Figure 34:
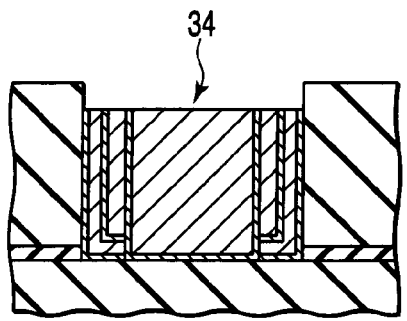
FIG. 34 is a sectional view showing a step in manufacturing the magnetic memory device according to the third modification of the present invention.

As shown in FIG. 34, the upper surfaces of the yoke layers 36 and interconnection portion 34 are recessed by, e.g., wet etching by using the same process as in the first embodiment.

Figure 35:
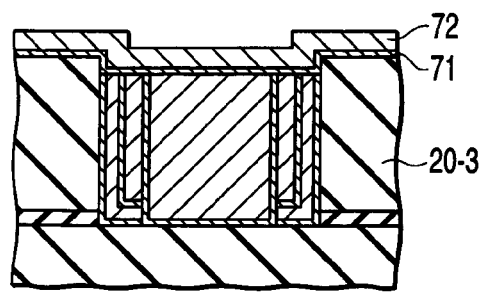
FIG. 35 is a sectional view showing a step in manufacturing the magnetic memory device according to the third modification of the present invention.

As shown in FIG. 35, a barrier metal film 71 is formed on the upper surfaces of the insulating layer 20-3 and the recessed yoke layers 36 and interconnection portion 34 by, e.g., CVD. Nickel-iron (NiFe) is deposited on the barrier metal film 71 by, e.g., CVD to form a magnetic layer 72.

Figure 36:
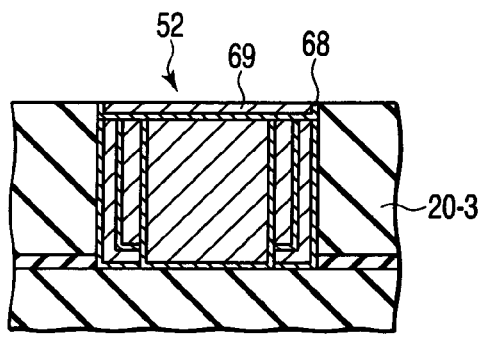
FIG. 36 is a sectional view showing a step in manufacturing the magnetic memory device according to the third modification of the present invention.

As shown in FIG. 36, the barrier metal film 71 and magnetic film 72 are planarized up to the upper surface of the insulating layer 20-3 by, e.g., CMP to fill the trench 52, thereby forming the barrier metal film 68 and yoke layer 69.

Figure 37:
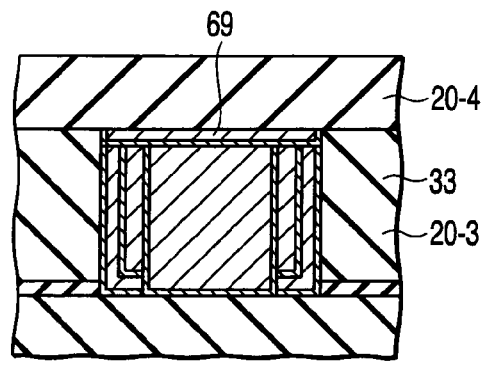
FIG. 37 is a sectional view showing a step in manufacturing the magnetic memory device according to the third modification of the present invention.

As shown in FIG. 37, the insulating layer 20-4 is formed on the insulating layer 20-3 and yoke layer 69 by a known process.

With the above-described manufacturing process, the write interconnection shown in FIG. 33 is manufactured.

As described above, according to the method of manufacturing the write interconnection of the magnetic memory device of this modification, the same-effect as in the first embodiment can be obtained.

[Fourth Modification (Modification 2 of Upper Write Interconnection)]

Figure 38:
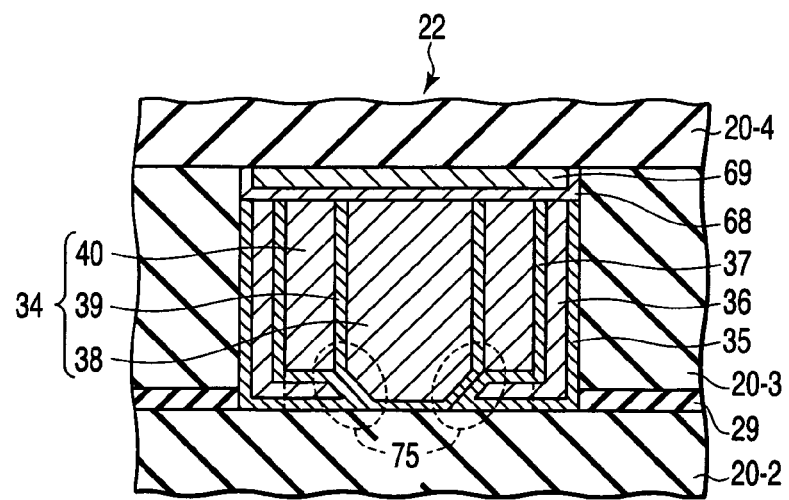
FIG. 38 is a sectional view showing a magnetic memory device according to the fourth modification of the present invention.

Another modification of the write interconnection 22 will be described next with reference to FIG. 38. FIG. 38 is a sectional view showing a write interconnection according to this modification. A description of the same parts as in the first embodiment will be omitted.

As shown in FIG. 38, ends 75 of the yoke layers 36 in contact with the sidewalls of the interconnection layer 38 which projects toward the MTJ element (not shown) have a taper angle (acute angle). For this reason, the interconnection layer 38 can easily be buried. Although not illustrated, the MTJ element and write interconnection 21 are formed under the write interconnection 22.

A method of manufacturing the write interconnection according to this modification will be described next taking the write interconnection shown in FIG. 38 as an example.

Figure 39:
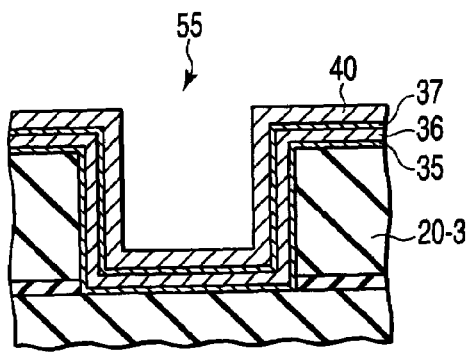
FIG. 39 is a sectional view showing a step in manufacturing the magnetic memory device according to the fourth modification of the present invention.

As shown in FIG. 39, the barrier metal film 35, yoke layers 36, and barrier metal film 37 are formed sequentially on the insulating layer 20-3 and along the inner wall of the trench 55 by the same process as in the first embodiment. Copper (Cu) is deposited on the barrier metal film 37 by, e.g., electroplating to form the interconnection layer 40.

Figure 40:
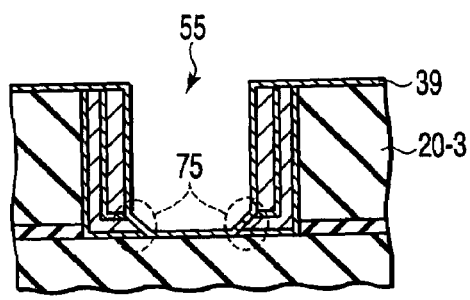
FIG. 40 is a sectional view showing a step in manufacturing the magnetic memory device according to the fourth modification of the present invention.

As shown in FIG. 40, anisotropic etching such as RIE with a taper angle is executed up to the upper surface of the insulating layer 20-2 to leave the yoke layers 36, barrier metal films 35 and 37, and interconnection layer 40 on the sidewalls of the trench 55. With this process, the yoke layers 36 which project to the inside of the trench 55 and have a taper angle at the ends 75 are formed.

The barrier metal film 39 is formed by the same process as in the first embodiment. After that, a copper (Cu) layer is deposited on the barrier metal film 39 by, e.g., electroplating. The copper layer is planarized up to the upper surface of the insulating layer 20-3 by, e.g., CMP to fill the trench 55, thereby forming the interconnection layer 38.

The yoke portion 69, barrier metal film 68, and insulating layer 20-4 are formed by the same process as in the first embodiment, thereby manufacturing the write interconnection shown in FIG. 38.

As described above, according to the method of manufacturing the write interconnection of the magnetic memory device according to this modification, the same effect as in the first embodiment can be obtained.

According to the manufacturing method of this modification, after the yoke layers 36 having a taper angle at the ends 75 are formed, a copper (Cu) layer is deposited by, e.g., electroplating. The copper layer is planarized up to the upper surface of the insulating layer 20-3 by, e.g., CMP to fill the trench 55 to form the interconnection layer 38. Since the ends 75 have an acute angle, the interconnection layer 38 such as the copper layer can easily be buried in the trench 55. In addition, when, for example, the trench 55 is deep, any void in the interconnection layer 38 in burying can be prevented since the interconnection layer 38 can easily be buried. Hence, the reliability can advantageously be increased.

[Fifth Modification (Modification 3 of Upper Write Interconnection)]

Figure 41:
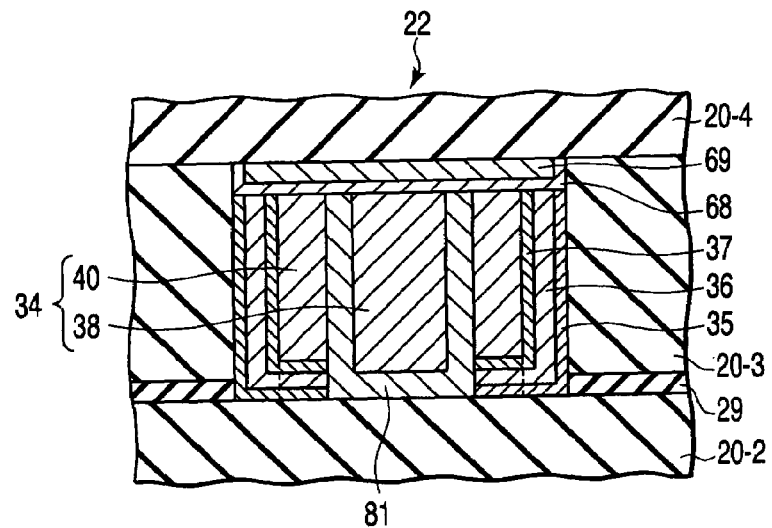
FIG. 41 is a sectional view showing a magnetic memory device according to the fifth modification of the present invention.

Still another modification of the write interconnection 22 will be described next with reference to FIG. 41. FIG. 41 is a sectional view showing a write interconnection according to this modification. A description of the same parts as in the first embodiment will be omitted.

As shown in FIG. 41, a high-resistance layer 81 is arranged to cover the sidewalls and bottom surface of the interconnection layer 38. The bottom surface of the high-resistance layer 81 and that of the barrier metal film 35 continue (are flush with each other). In other words, the projecting portion of the interconnection portion 34 toward the MTJ element has a high resistance. The high-resistance layer 81 sandwiched between the yoke layers 36 is arranged. The bottom surface of the high-resistance layer 81 and that of the barrier metal film 35 continue.

The high-resistance layer 81 is made of, e.g., tantalum (Ta), tantalum nitride (TaN), or titanium nitride (TiN). In place of the high-resistance layer, an insulating layer having a higher resistance value may be formed at the position of the high-resistance layer. Although not illustrated, the MTJ element and write interconnection 21 are formed under the write interconnection 22.

According to the above-described structure, the same effect as in the first embodiment can be obtained. In addition, since the high-resistance layer 81 is arranged, the write current flowing between the yoke layers 36 can be reduced, and nonuniformity of the magnetic field can further be relaxed.

When an insulating layer having a higher resistance value is formed at the position of the high-resistance layer 81, the write current flowing between the yoke layers 36 can further be reduced.

A method of manufacturing the write interconnection according to this modification will be described next taking the write interconnection shown in FIG. 41 as an example.

Figure 42:
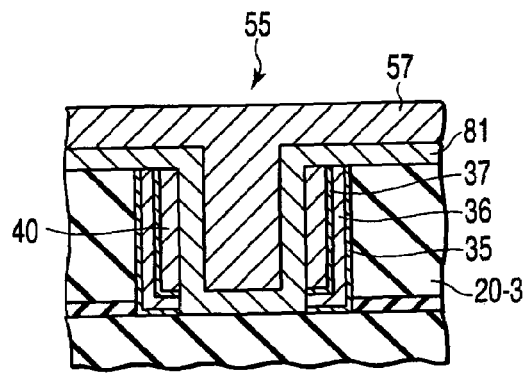
FIG. 42 is a sectional view showing a step in manufacturing the magnetic memory device according to the fifth modification of the present invention.

As shown in FIG. 42, the yoke layers 36, barrier metal films 35 and 37, and interconnection layer 40 are formed by the same process as in the first embodiment. After that, tantalum (Ta) is deposited along the inner walls of the barrier metal films 35 and 37 and interconnection layer 40 by, e.g., CVD to form the high-resistance layer 81. In addition, the conductive layer 57 is formed on the high-resistance layer 81 and in the trench 55.

Figure 43:
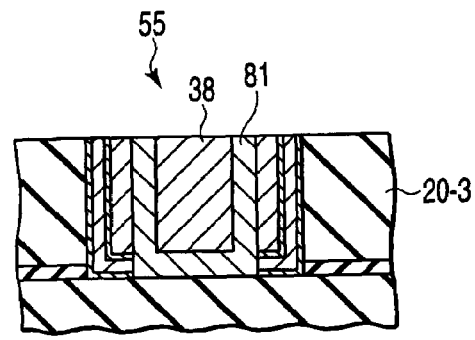
FIG. 43 is a sectional view showing a step in manufacturing the magnetic memory device according to the fifth modification of the present invention.

As shown in FIG. 43, the high-resistance layer 81 and conductive layer 57 are planarized up to the upper surface of the insulating layer 20-3 by, e.g., CMP to fill the trench 55. The write interconnection shown in FIG. 41 is manufactured by a known process.

According to the method of manufacturing the write interconnection of the magnetic memory device, the same effect as in the first embodiment can be obtained.

Second Embodiment

1T1MTJ

A magnetic memory device according to the second embodiment of the present invention will be described next with reference to FIG. 44. This embodiment is an example of a so-called 1T1MTJ (1 transistor-1 MTJ) magnetic memory device. A description of the same parts as in the first embodiment will be omitted.

Figure 44:
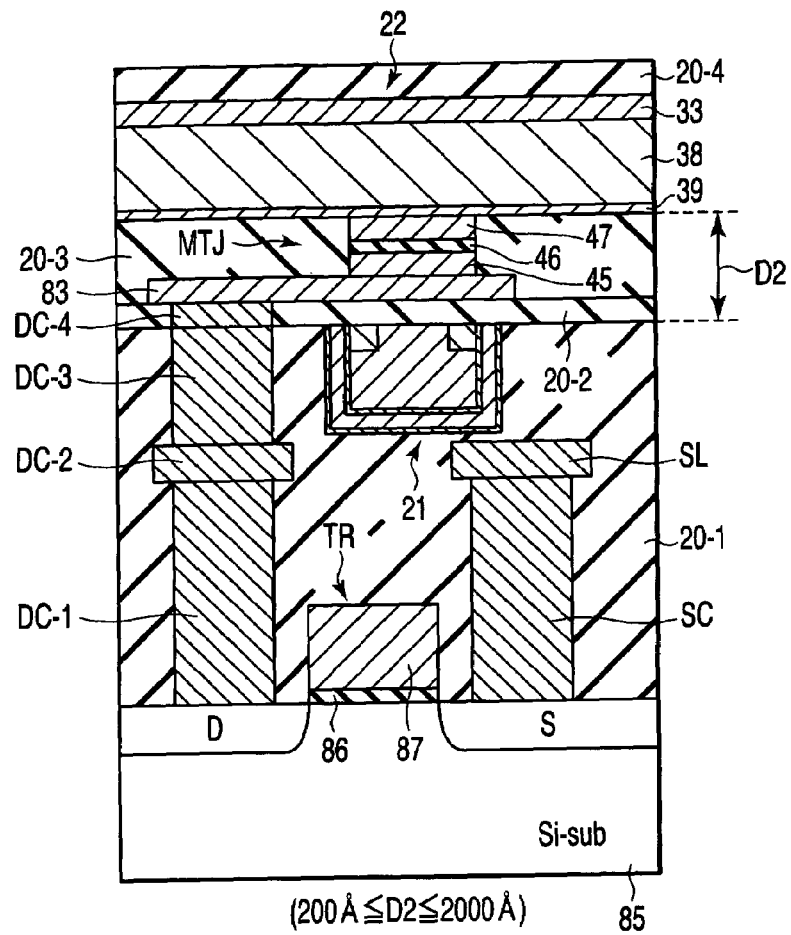
FIG. 44 is a sectional view showing a magnetic memory device according to the second embodiment of the present invention.

As shown in FIG. 44, the 1T1MTJ magnetic memory device according to the second embodiment is different from the magnetic memory device according to the first embodiment in the following points. Write interconnections 21 and 22 cross each other. An MTJ element is arranged at the intersection between them. The upper surface of a ferromagnetic layer 47 of the MTJ element is in contact with the write interconnection 22 and is electrically connected to the interconnection 22. The bottom surface of a ferromagnetic layer 45 of the MTJ element is in contact with an undercoat conductive layer 83 extracted in the direction of interconnection 22 and is electrically connected to the undercoat conductive layer 83. A select transistor TR is arranged on a substrate 85. The undercoat conductive layer 83 is electrically connected to a drain D of the select transistor TR through drain contacts DC-1 to DC-4. The select transistor TR comprises a gate insulating film 86 formed on the substrate 85, a gate electrode 87 formed on the gate insulating film 86, and a source S and drain D formed in the gate electrode 87 to sandwich the gate electrode 87. A source contact SC is formed on the source S, and a source line SL is formed on the source contact SC. A distance D2 between the write interconnections 21 and 22 falls within the range of 200 to 2,000 Å (200 Å≦D2≦2,000 Å).

According to the above-described structure, the same effect as in the first embodiment can be obtained. In addition, the magnetic memory device according to this embodiment has the select transistor TR electrically connected to the bottom surface of the MTJ element. When the MTJ elements are laid out in an array, a so-called sneak current which flows into MTJ elements except the selected MTJ element can be prevented so that data can be written in or read out from only the selected MTJ element.

The method of manufacturing the main part of the magnetic memory device according to this embodiment is almost the same as in the first embodiment, and a description thereof will be omitted.

Third Embodiment

Cross-Point

Figure 45:
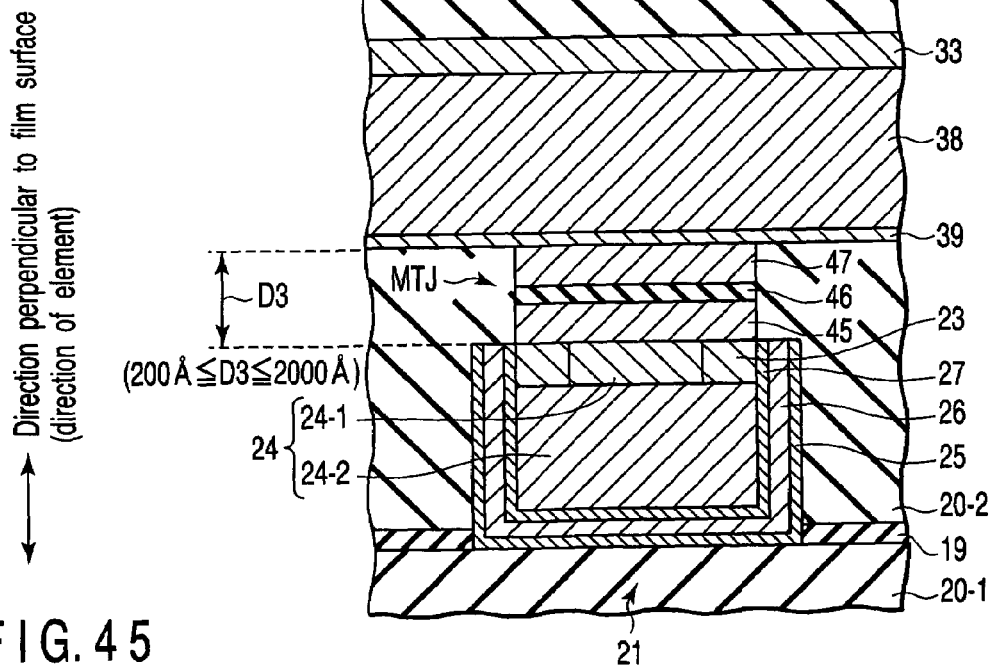
FIG. 45 is a sectional view showing a magnetic memory device according to the third embodiment of the present invention.

A magnetic memory device according to the third embodiment of the present invention will be described next with reference to FIG. 45. This embodiment is an example of a so-called cross-point magnetic memory device. FIG. 45 is a sectional view showing the magnetic memory device according to this embodiment. A description of the same parts as in the first embodiment will be omitted.

As shown in FIG. 45, the cross-point magnetic memory device according to the third embodiment is different from the magnetic memory device according to the first embodiment in the following points. Write interconnections 21 and 22 cross each other. An MTJ element is arranged at the intersection between them. The upper surface of a ferromagnetic layer 47 of the MTJ element is in contact with the write interconnection 22 and is electrically connected to the interconnection 22. The bottom surface of a ferromagnetic layer 45 of the MTJ element is in contact with the write interconnection 21 and is electrically connected to the interconnection 21. A distance D3 between the write interconnections 21 and 22 falls within the range of 200 to 2,000 Å (200Å≦D3≦2,000 Å)

According to the above-described structure, the same effect as in the first embodiment can be obtained. In addition, the magnetic memory device according to this embodiment has no select transistor, unlike the second embodiment. The cell area can be reduced because no select transistor need be arranged. Hence, the device size can be reduced.

The method of manufacturing the main part of the magnetic memory device according to this embodiment is almost the same as in the first embodiment, and a description thereof will be omitted.

Fourth Embodiment

Cross-Point

Figure 46:
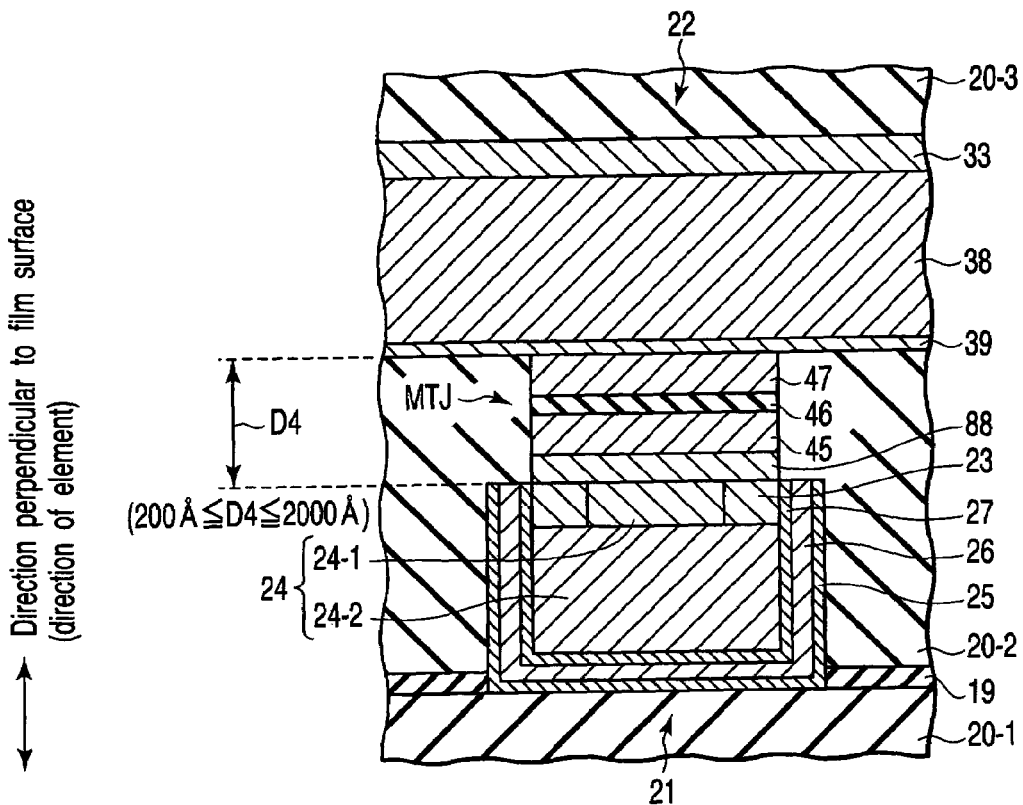
FIG. 46 is a sectional view showing a magnetic memory device according to the fourth embodiment of the present invention.

A magnetic memory device according to the fourth embodiment of the present invention will be described next with reference to FIG. 46. This embodiment is anther example of a so-called cross-point magnetic memory device. FIG. 46 is a sectional view showing the magnetic memory device according to this embodiment. A description of the same parts as in the third embodiment will be omitted.

As shown in FIG. 46, the cross-point magnetic memory device according to the fourth embodiment is different from the magnetic memory device according to the third embodiment in that a diode layer 88 is further arranged between a ferromagnetic layer 45 and a write interconnection 21. The diode layer 88 can be arranged between a ferromagnetic layer 47 and a write interconnection 22.

According to the above-described magnetic memory device, the same effect as in the third embodiment can be obtained. In addition, the magnetic memory device according to this embodiment has the diode layer 88 between the MTJ element and the write interconnection 21. For this reason, a so-called sneak current can be prevented, and the reliability can advantageously be increased.

At least one diode layer 88 suffices between the MTJ element and the write interconnection 21 or between the MTJ element and the write interconnection 22. Since an increase in occupation area in the direction of MTJ element can be reduced, the device size can advantageously be decreased.

The method of manufacturing the main part of the magnetic memory device according to this embodiment is almost the same as in the first embodiment, and a description thereof will be omitted.

Fifth Embodiment

Toggle-Cell

Figure 47:
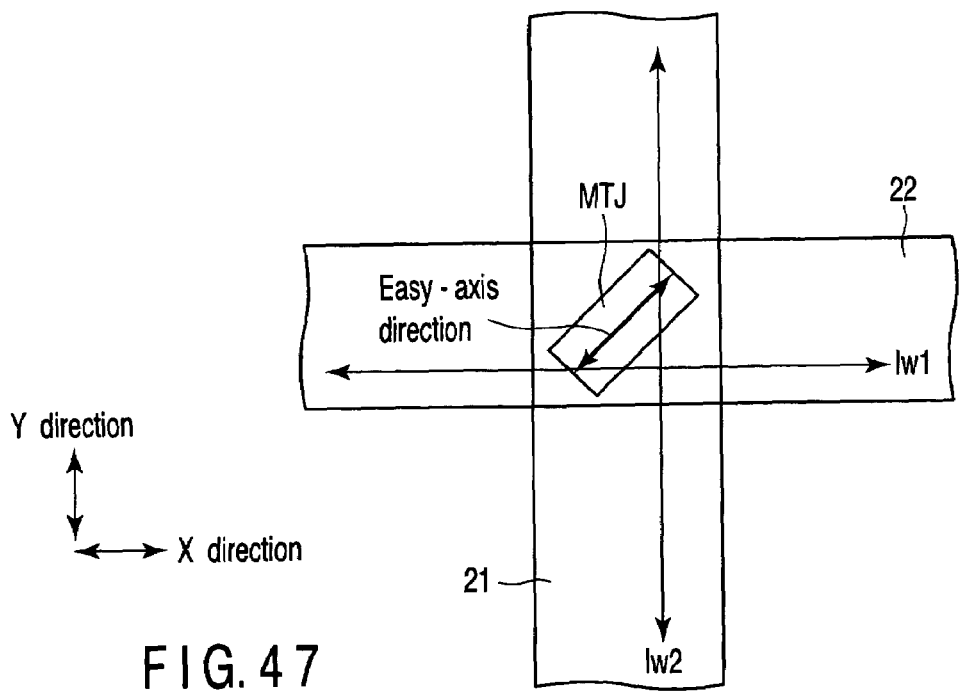
FIG. 47 is a sectional view showing a magnetic memory device according to the fifth embodiment of the present invention.

A magnetic memory device according to the fifth embodiment of the present invention will be described next with reference to FIG. 47. This embodiment is an example of a so-called toggle-cell magnetic memory device. FIG. 47 is a plan view showing the magnetic memory device according to this embodiment. A description of the same parts as in the first embodiment will be omitted.

As shown in FIG. 47, the toggle-cell magnetic memory device according to the fifth embodiment is different from the magnetic memory device according to the first embodiment in the following points. The axis of easy magnetization of the MTJ element is tilted with respect to the running direction (X direction) of a write interconnection 22 or the running direction (Y direction) of a write interconnection 21. In other words, the direction of a write current Iw1 to be supplied to the write interconnection 22 is tilted with respect to the direction of a write current Iw2 to be supplied to the write interconnection 21. The tilt of the MTJ element is, e.g., 30° to 60°, and preferably, 45°. The sectional structure is the same as in FIG. 45.

In the toggle cell, the data write and read are executed in the following way.

A confirmation cycle to read out data of a selected cell is executed before the write operation. If it is determined by reading out the data of the selected cell that arbitrary data has already been written, no write is executed. If data different from the arbitrary data has been written, the write is executed to rewrite the data.

After the above-described confirmation cycle, if data must be written in the selected cell, the two write interconnections 21 and 22 are sequentially turned on. The write interconnection which has been turned on first is turned off first. Then, the write interconnection which has been turned on later is turned off. For example, the procedures include four cycles: the write interconnection 22 is turned on to supply the write current Iw1→the write interconnection 21 is turned on to supply the write current Iw2→the write interconnection 22 is turned off to stop supplying the write current Iw1→the write interconnection 21 is turned off to stop supplying the write current Iw2.

In the data read operation, a read current is supplied to the write interconnections 21 and 22 connected to the selected MTJ element, thereby reading out the data of the MTJ element.

In the toggle-cell magnetic memory device, preferably, a free layer (ferromagnetic layer) 47 has a three-layered structure including at least a ferromagnetic layer, nonmagnetic layer, and ferromagnetic layer, and the two ferromagnetic layers are anti-ferromagnetically coupled.

According to the above-described structure, the same effect as in the first embodiment can be obtained. In the toggle-cell magnetic memory device according to this embodiment, the axis of easy magnetization of the MTJ element is tilted with respect to the running direction (X direction) of the write interconnection 22 or the running direction (Y direction) of the write interconnection 21. The write operation is executed in accordance with the four-cycle procedures.

Hence, when a write current is supplied to one of the write interconnections 21 and 22, write access to an unselected cell, i.e., a write error in a semi-selected cell can be reduced, and the reliability can be increased.

The method of manufacturing the main part of the magnetic memory device according to this embodiment is almost the same as in the first embodiment, and a description thereof will be omitted.

The write interconnections 21 and 22 described in the first to fifth embodiments are merely examples. Various kinds of write interconnections 21 and 22 described in the first to fifth modifications can be applied.

The present invention can be applied not only to a magnetic memory device having an MTJ element but also to a magnetic memory device having any other magnetoresistance effect element such as a giant magnetoresistance (GMR) element or colossal magnetoresistance (CMR) element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
a magnetoresistance effect element;
a first write interconnection which is arranged under the magnetoresistance effect element and has a first interconnection layer and a first yoke layer, the first interconnection layer having a portion projecting toward the magnetoresistance effect element, and the first yoke layer including a first region which covers sidewalls of the first interconnection layer, a second region which covers a bottom surface of the first interconnection layer, and third regions which are formed in contact with sidewalls of the projecting portion and magnetically coupled to the first region and second region; and
a second write interconnection which is arranged above the magnetoresistance effect element and has a second interconnection layer and a second yoke layer, the second interconnection layer having a portion projecting toward the magnetoresistance effect element, and the second yoke layer including a fourth region which covers sidewalls of the second interconnection layer, a fifth region which covers an upper surface of the second interconnection layer, and sixth regions which are formed in contact with sidewalls of the projecting portion and magnetically coupled to the fourth region and fifth region.

2. A device according to claim 1, wherein a distance between the first write interconnection and the second write interconnection is 200 Å to 2,000 Å.

3. A device according to claim 1, wherein the projecting portion of the first interconnection layer is made of a material having a higher resistance value than that of remaining portions of the first interconnection layer.

4. A device according to claim 1, wherein the projecting portion of the second interconnection layer is made of a material having a higher resistance value than that of remaining portions of the second interconnection layer.

5. A device according to claim 1, wherein ends of the third regions and the sixth regions in contact with the sidewalls of the projecting portions have a taper angle.

6. A device according to claim 1, wherein upper surfaces of the first region and third regions of the first yoke layer and an upper surface of the projecting portion of the first interconnection layer continue.

7. A device according to claim 1, wherein bottom surfaces of the fourth region and sixth regions of the second yoke layer and a bottom surface of the projecting portion of the second interconnection layer continue.

8. A device according to claim 1, further comprising a barrier metal film which covers surfaces of the first region and second region.

9. A device according to claim 1, further comprising a barrier metal film which covers surfaces of the fourth region and sixth region.

10. A device according to claim 1, further comprising a barrier metal film which covers sidewalls and bottom surface of the fifth region.

11. A device according to claim 1, in which
the first write interconnection and second write interconnection are laid out to cross each other,
the magnetoresistance effect element is arranged at an intersection between the first write interconnection and the second write interconnection, and an upper surface of the magnetoresistance effect element is in contact with the second write interconnection and is electrically connected to the second write interconnection, and
which further comprises
an undercoat conductive layer which is in contact with a bottom surface of the magnetoresistance effect element and is extracted in a direction of the second write interconnection; and
a select transistor which has a current path having an end electrically connected to the magnetoresistance effect element through the undercoat conductive layer.

12. A device according to claim 1, wherein
the first write interconnection and second write interconnection are laid out to cross each other, and
the magnetoresistance effect element is arranged at an intersection between the first write interconnection and the second write interconnection, an upper surface of the magnetoresistance effect element is in contact with the second write interconnection and is electrically connected to the second write interconnection, and a bottom surface of the magnetoresistance effect element is in contact with the first write interconnection and is electrically connected to the first write interconnection.

13. A device according to claim 12, further comprising a diode layer which is arranged between the magnetoresistance effect element and the first interconnection layer.

14. A device according to claim 1, wherein
the first write interconnection and second write interconnection are laid out to cross each other, and
the magnetoresistance effect element is arranged at an intersection between the first write interconnection and the second write interconnection, and an axis of easy magnetization of the magnetoresistance effect element is tilted with respect to one of a running direction of the first write interconnection and a running direction of the second write interconnection.

* * * * *